United States Patent
Nariman et al.

(10) Patent No.: US 6,249,032 B1
(45) Date of Patent: *Jun. 19, 2001

(54) SEMICONDUCTOR DEVICE HAVING PATTERNED METAL LAYER OVER A POLYSILICON LINE AND METHOD OF FABRICATION THEREOF

(75) Inventors: Homi E. Nariman; H. Jim Fulford; Charles E. May, all of Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/165,051

(22) Filed: Oct. 1, 1998

(51) Int. Cl.$^7$ .................................................. H01L 29/41
(52) U.S. Cl. .......................... 257/401; 257/365; 257/773; 257/775
(58) Field of Search .................................... 257/342, 366, 257/331, 758, 369, 365, 412, 413, 208, 401, 283, 287, 748, 773, 775, 776

(56) References Cited

U.S. PATENT DOCUMENTS

| | | | |
|---|---|---|---|
| 5,614,762 | * 3/1997 | Kanamori et al. | 257/69 |
| 5,675,187 | * 10/1997 | Numata et al. | 257/758 |
| 5,719,429 | * 2/1998 | Yoshida et al. | 257/401 |
| 5,900,668 | * 5/1999 | Wollesen | 257/522 |

* cited by examiner

*Primary Examiner*—Eddie C. Lee
*Assistant Examiner*—Bradley Wm. Baumeister

(57) ABSTRACT

A semiconductor device and fabrication process are provided in which a patterned metal layer is formed over a polysilicon line. The polysilicon line is disposed on a substrate and may, for example, be a gate electrode. A dielectric layer is disposed adjacent the polysilicon line and the patterned metal layer is formed over the polysilicon line. The device may further include a second polysilicon line, such as a gate electrode, and the patterned metal layer may extend over the top of the second polysilicon line and interconnect the two polysilicon lines. A contact for the polysilicon line is coupled to the patterned metal layer. The use of a patterned metal line may provide a larger footprint for the contact then the underlying polysilicon line(s) and may decrease the sheet resistance to the polysilicon line(s).

20 Claims, 3 Drawing Sheets

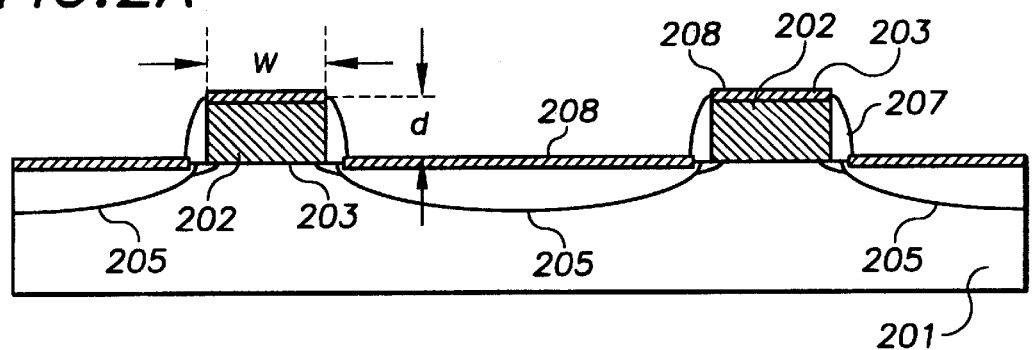
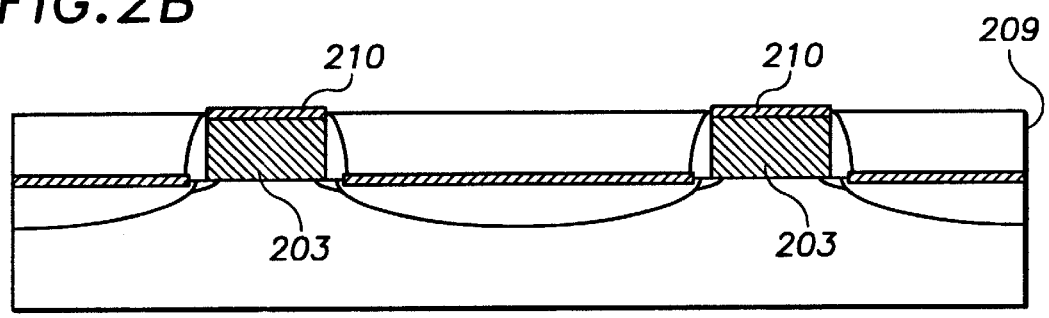
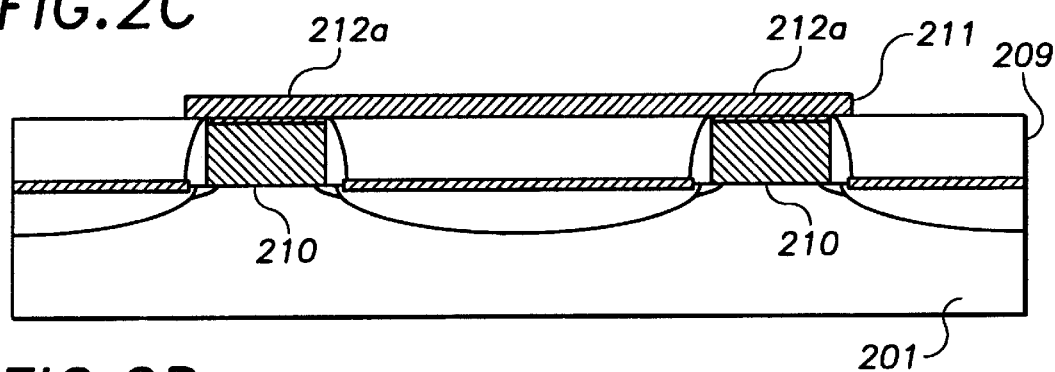
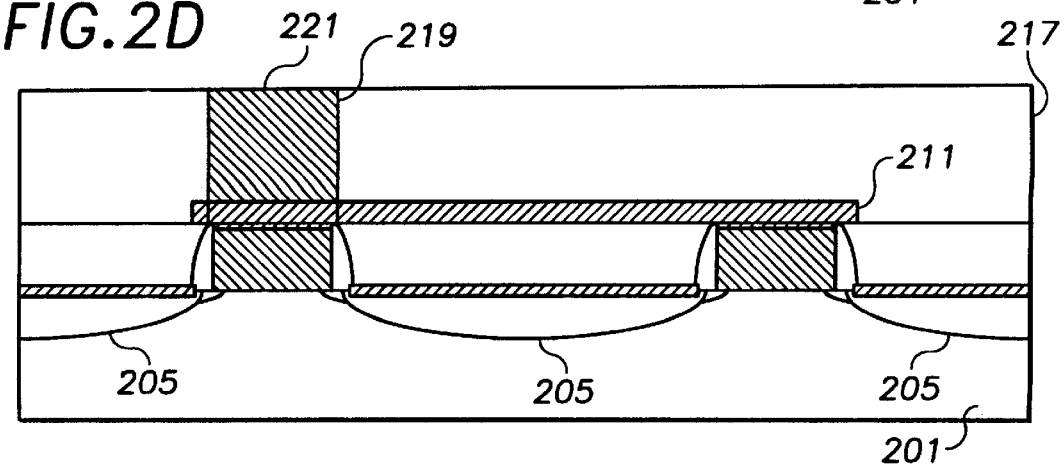

US 6,249,032 B1

SEMICONDUCTOR DEVICE HAVING PATTERNED METAL LAYER OVER A POLYSILICON LINE AND METHOD OF FABRICATION THEREOF

FIELD OF THE INVENTION

The present invention is directed generally to semiconductor devices and, more particularly, to a semiconductor device having patterned metal layer over a polysilicon line and a method of forming such a semiconductor device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a polysilicon line which acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as SiO2. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

In a completed device structure, the source/drain regions 105 and gate electrode 103 (as well as other types of polysilicon lines) are typically contacted by metal contacts in order to interconnect these structures with other elements of the device. Prior to forming the metal contacts, silicidation layers 111 are typically formed over the source/drain regions 105 and the gate electrode 103. The silicidation layers 111 are typically formed by depositing a layer of metal, such as tungsten or cobalt, over the substrate 101 and annealing the wafer. During the annealing process, the deposited metal reacts with the underlying silicon substrate and polysilicon gate electrode to form the silicidation layers 111. The silicidation layers 111 facilitate contact between the metal contacts and the source/drain regions 105 and the gate electrode 103 and also lower the sheet resistance of the source/drain regions 105 and the gate electrode 103.

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). To accomplish these goals, it is desirable to reduce the size of the semiconductor devices without degrading their performance.

As the device is made smaller fabrication complexity typically increases and conventional techniques for fabricating semiconductor devices may give rise to new problems. For instance, conventionally formed silicide layers on small-scale gate electrodes (e.g., 0.18 microns or less) typically have higher sheet resistances than similar silicides on larger gate electrodes. The increase in sheet resistance typically has a significant deleterious impact on device performance. In addition, the narrow width of small scale gate electrodes presents significant contact problems. New semiconductor fabrication processes and devices are there needed to continue the trend of reduced semiconductor device size and increased performance.

SUMMARY OF THE INVENTION

Generally, the present invention relates to a semiconductor device having at least one polysilicon line having an extended patterned metal layer and a method of fabricating such as device.

In one embodiment of the invention, a polysilicon line is formed on a substrate of the semiconductor device. The polysilicon line may, for example, be a gate electrode. A dielectric layer is forming over the substrate and adjacent the polysilicon line and a patterned metal layer having a greater width than the polysilicon line is formed over the polysilicon line. A dielectric layer is then formed over the patterned metal layer and a contact is formed to the patterned metal layer.

In another embodiment of the invention, a process of forming a semiconductor device is provided in which first and second polysilicon lines are formed on a substrate and a dielectric layer is formed adjacent the first and second polysilicon lines. Next, there is formed a patterned metal layer including first and second metal lines each disposed over a respective first and second polysilicon lines and each having a greater width than the respective polysilicon line. The patterned metal layer further includes a portion connecting the first and second metal lines. A dielectric layer is then formed over the patterned metal layer and a contact is formed in the dielectric layer to the patterned metal layer.

A semiconductor device, in accordance with one embodiment of the invention, includes a substrate, at least one polysilicon line disposed over the substrate, and a patterned metal layer having a greater width than the polysilicon line is disposed on top of the polysilicon line. The patterned metal layer includes an edge which extends beyond an edge of the polysilicon line by 10% or more of the polysilicon line width. The polysilicon line may, for example, be a gate electrode. The device may further include a second polysilicon line, such as a gate electrode, and the patterned metal layer may extend over the top of the second polysilicon line and interconnect the two polysilicon lines. A dielectric layer may be disposed over the patterned metal layer and a contact to the patterned metal layer may be formed in the dielectric layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 2A–2D and 2A' and 2C' illustrate a fabrication process in accordance with one embodiment of the invention.

Figure 1:
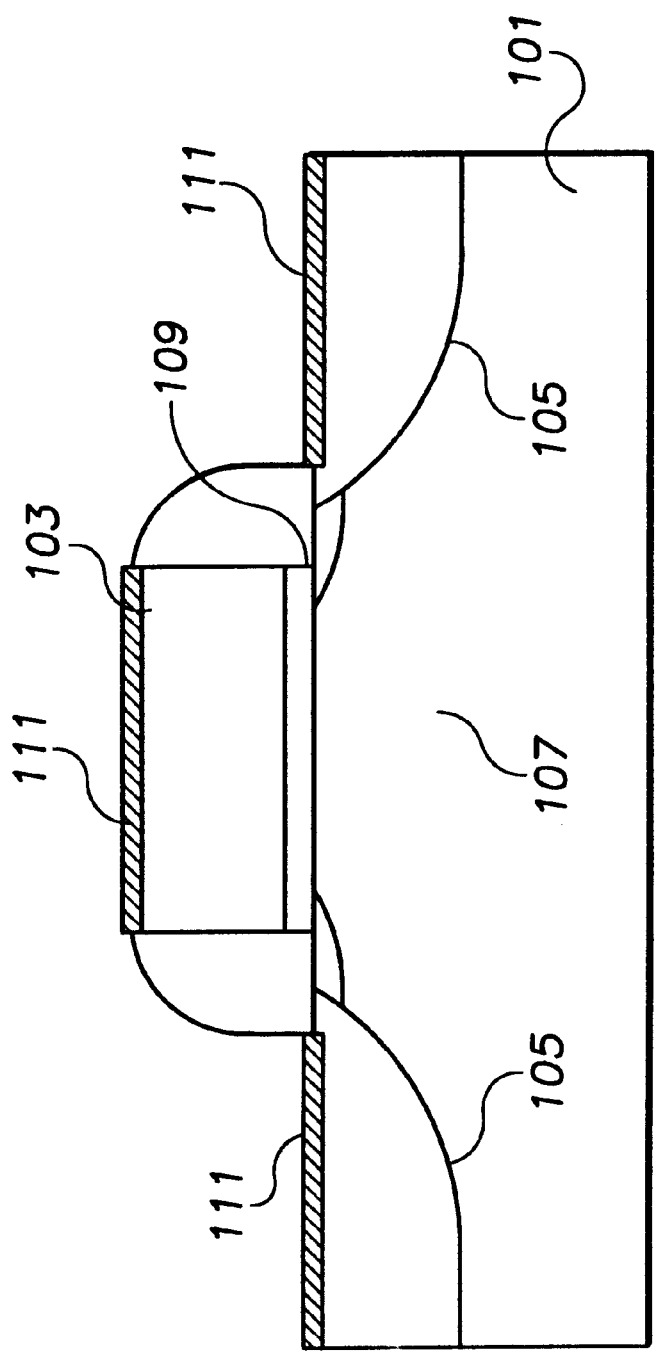
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally applicable to the formation of patterned metal layers on polysilicon lines in a number of semiconductor devices, including in particular MOS structures, such as PMOS, NMOS, CMOS and BiCMOS devices. The invention is particularly suited to the formation of a patterned metal layer for small scale polysilicon lines (e.g., having widths of 0.25 microns or less). While the present invention is not so limited, an appreciation of various aspects of the invention will be gained through a discussion of the fabrication process and characteristics of such a device in connection with the examples provided below.

FIGS. 2A–2D and 2A' and 2C' illustrate a process for fabricating a semiconductor device having a patterned metal layer on a polysilicon line. Using known techniques, one or more polysilicon lines (two of which are shown) are formed on a substrate 201. The polysilicon lines 202 generally have a relative narrow width w and depth d as compared to their length. While the invention is not limited to any particular dimensions, typical widths w of the polysilicon lines 202 range from about 0.18 to 0.5 microns, and typical depths d range from about 1000 to 3000 angstroms (Å). The polysilicon lines 202 may, for example, be used as gate electrodes 203 for a MOS device or may be other types of lines which extend over the substrate. As should be appreciated when used as gate electrodes 203, the polysilicon lines 202 are typically insulated from the substrate by a thin gate insulating layer (not shown), such as an oxide layer.

Figure 2A:
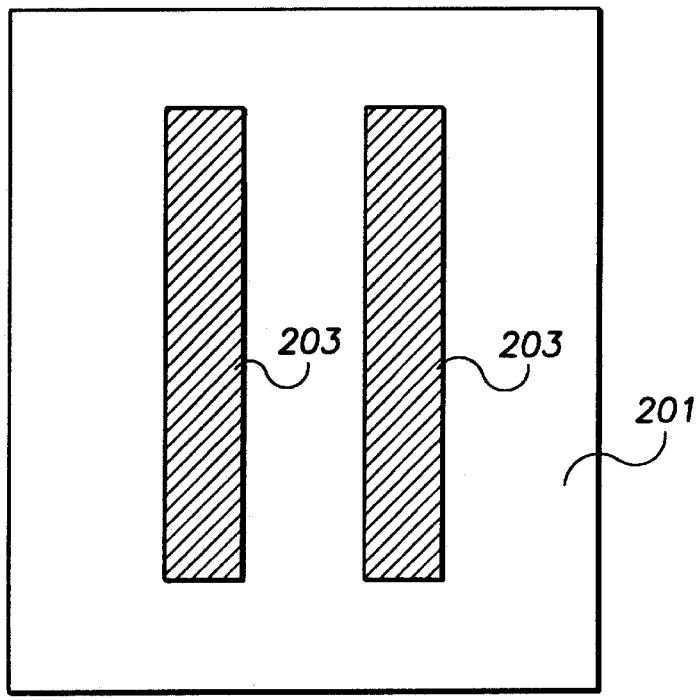

Following formation of the gate electrodes 203, source/drain regions 205 may be formed in the substrate 201 adjacent the gate electrodes 203. The source/drain regions 205 may, for example, be lightly-doped drain (LDD) source/drain regions formed using well known implantation techniques. Spacers 207 may be formed on sidewalls of the gate electrodes 203 during or after the formation of the source/drain regions 205. The spacers 207 may be formed from a number of different dielectric materials, such as oxides, using known spacer formation techniques. After forming the spacers 207, silicide layers 208 may be formed on exposed portions of the gate electrodes 203 and source/drain regions 205. The silicide layers 208 may be formed using standard silicidation techniques. The resultant structure is illustrated in FIGS. 2A and 2A'.

A dielectric layer 209 is formed over the substrate 201 and adjacent the gate electrodes 203, as illustrated in FIG. 2B. The dielectric layer 209 may be formed from a number of different dielectric materials, including oxides such as silicon dioxide and silicon oxynitride, for example. The dielectric layer 209 may be formed by depositing a layer of dielectric material over the substrate 201 and planarizing the dielectric material to expose the silicide layers 208 on the gate electrodes 203. The deposition and planarization may be done using, for example, known deposition and polishing techniques. Planarization of the dielectric layer 209 may be followed by a polish of the gate electrode/silicide layer structures 210 in order to buff the upper surface of the gate structures 210. Typically, the planarization of the dielectric layer 209 and polish of the gate structures 210, if any, are performed using etchants which are selective to the layer being planarized or polished. After polishing the gate structures 210, a smaller amount of the gate electrode silicide layers 208 typically remains. In other embodiments, these silicide layers 208 may be entirely removed.

A patterned metal layer 211 is formed over the dielectric layer 209 and the gate structures 210. The patterned metal layer 211 may, for example, be formed by depositing a layer of metal over the substrate 201 and selectively removing portions of the metal layer to form the desired pattern. Selective removal of the metal layer 211 may be carried out using, for example, known photolithography and etching techniques. The patterned metal layer 211 will be generally used to lower the resistance of the gate electrode 203 to a subsequent conductive contact, and, in this case, will be used as a local interconnect between the two gate electrodes 203. Suitable thicknesses of the patterned metal layer 211 range from 500 to 2,000 Å for many applications.

Figure 2C:
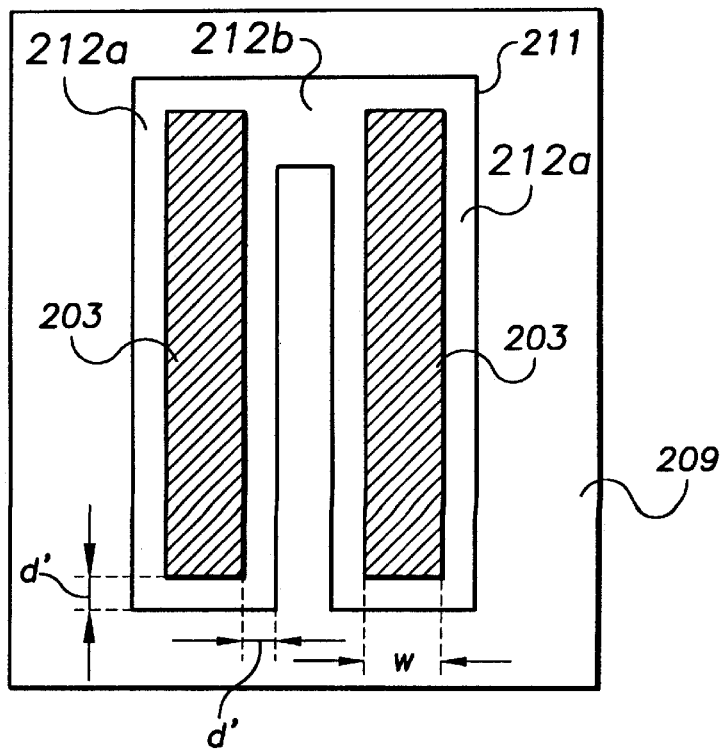

The patterned metal layer 211 (as best shown in FIG. 2C') typically includes metal lines 212a, which generally correspond to the shape of the underlying gate electrode lines 203, and a portion 212b which interconnects the two metal lines 212a to complete the local interconnect between the two gate electrodes 203. In accordance with one aspect of the invention, each patterned metal layer line 212a extends beyond edges of the respective gate electrode 203. This overlap allows the patterned metal layer lines 212a to have a footprint larger than the footprint of the underlying gate electrode 203 and also compensates for any misalignment between the patterned metal layer 211 and the gate electrodes 203. The distance d' by which the edges of the patterned metal layer lines 212a may extend beyond the edges of the respective gate electrode 203 may range from 10 to 50% or more of the width w of a gate electrode 203. The resultant structure is illustrated in FIG. 2C. A top view of the resultant structure is shown in FIG. 2C'. While the illustrated patterned metal layer lines 212a extend a uniform distance d' beyond each edge of the gate electrode 203 (save at the connecting portion 212b), the present invention is not so limited. Patterned metal layers which are asymmetric with respect to an underlying gate electrode may also be formed.

A dielectric layer 217 is formed over the patterned metal layer 211. The dielectric layer 217 may be formed using known deposition techniques, for example. Portions of the dielectric layer 217 are then removed to form contact openings 219 (only one of which is showing) to the patterned metal layer 211 and source/drain regions 205. This may be done using known photolithography and etching techniques. The contact openings 219 are then filled with a conductive material 221, such as a metal, to form contacts to the underlying active devices. Fabrication of the device may continue with known processing steps, such as metal line formation and so forth, to complete the ultimate device structure.

Using the above process, local interconnection between gate electrodes and/or polysilicon lines may be accomplished through the formation of a patterned metal layer. The patterned metal layer can also provide a larger footprint for a subsequent contact and can increase device performance and reliability by, for example, lowering the sheet resistance between the polysilicon line and the subsequent contact. This enables the polysilicon line to be scaled down without significantly degrading the performance or reliability of the device. Using the above techniques, reliable, low resistance contacts to underlying polysilicon lines may be formed on polysilicon lines having widths of 0.18 microns or less. In addition, using the patterned metal layer for local interconnects provides additional flexibility in semiconductor fabrication.

While illustrative, the present invention is not limited to the above process. For instance, a patterned metal layer may be disposed over a single polysilicon line without connecting another polysilicon line. In addition, the above process may be used to form a patterned metal layer which locally interconnects more than two polysilicon lines and/or to locally interconnect polysilicon lines which are not adjacent. Moreover, while the illustrated gate electrodes 203 share a common source/drain region 205, it should be appreciated that the present invention is not so limited. Isolated gate electrodes may also be locally interconnected using a patterned metal layer.

As noted above, the present invention is applicable to the fabrication of a number of different devices where a patterned metal layer on a polysilicon line is desirable. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor device, comprising:
   a substrate and a pair of non-intersecting polysilicon lines, each line having a width disposed over the substrate;
   a patterned metal layer disposed on top of and interconnecting the non-intersecting polysilicon lines and having a width greater than the width of one of the polysilicon lines, the patterned metal layer including edges which extend beyond the edges of each polysilicon line by about at least 10% of the polysilicon line width or more, and beyond a respective edge of each polysilicon line by about the same distance;
   a dielectric layer disposed over the patterned metal layer; and
   a conductive contact disposed in the dielectric layer in contact with the patterned metal layer.

2. The device of claim 1, wherein the patterned metal layer edge extends beyond the edge of each polysilicon line by 25% of the polysilicon line width or more.

3. The device of claim 1, wherein the edge of the patterned metal layer extends beyond the edge of each polysilicon line by 50% of the polysilicon line width or more.

4. The device of claim 1, further including a second dielectric layer disposed between the polysilicon lines and having an upper surface substantially planar with upper surfaces of the polysilicon lines.

5. The device of claim 4, wherein the patterned metal layer has a substantially planar top surface.

6. The device of claim 1, wherein the conductive contact is electrically coupled to the pair of non-intersecting polysilicon lines.

7. The device of claim 6, wherein the patterned metal layer is asymmetrical with respect to the underlying polysilicon lines.

8. The device of claim 1, wherein the width of the polysilicon lines range from about 0.18–0.5 microns and have a depth of about 1000–3000 Angstroms.

9. A semiconductor device, comprising:
   a substrate and a pair of non-intersecting gate electrode lines, each line having a width disposed over the substrate;
   a patterned metal layer disposed on top of and interconnecting the non-intersecting gate electrode lines and having a width greater than the width of one of the gate electrode lines, the patterned metal layer including edges which extend beyond the edges of each gate electrode line by about at least 10% of the gate electrode line width or more, and beyond a respective edge of each gate electrode line by about the same distance;

a dielectric layer disposed over the patterned metal layer; and a conductive contact disposed in the dielectric layer in contact with the patterned metal layer and coupled to the pair of gate electrode lines.

10. The device of claim 9, wherein the gate electrode lines form part of a transistor, the transistor having a source region and a drain region adjacent each gate electrode line, the source and drain regions having a silicide contact formed thereon.

11. The device of claim 10, further including a common source region disposed in between the pair of gate electrodes.

12. The device of claim 10, further including spacers disposed on both sides of the gate electrode lines with lightly doped regions formed in the substrate adjacent to the gate electrode lines.

13. The device of claim 9, wherein the patterned metal layer is asymmetrical with respect to the underlying gate electrode lines.

14. The device of claim 9, wherein the gate electrodes are coplanar.

15. The device of claim 9, wherein the patterned metal layer edge extends beyond the edge of each gate electrode line by 25% of the gate electrode line width or more.

16. The device of claim 9, wherein the edge of the patterned metal layer extends beyond the edge of each gate electrode line by 50% of the gate electrode line width or more.

17. The device of claim 9, further including a second dielectric layer disposed between the gate electrode lines and having an upper surface substantially planar with upper surfaces of the gate electrode lines.

18. The device of claim 17, wherein the patterned metal layer has a substantially planar top surface.

19. The device of claim 9, wherein the patterned metal layer has a form that interconnects electrically the gate electrode lines at an end portion of the metal layer.

20. The device of claim 9, wherein the patterned metal layer has a thickness in the range of 500–2000 Angstroms.

* * * * *